(12) United States Patent
Zeng et al.

(10) Patent No.: US 10,438,676 B2
(45) Date of Patent: Oct. 8, 2019

(54) BIDIRECTIONAL SHIFT REGISTER UNITS, BIDIRECTIONAL SHIFT REGISTERS, AND DISPLAY PANELS

(71) Applicant: Shenzhen China Star Optoelectronics Technology Co., Ltd., Shenzhen, Guangdong (CN)

(72) Inventors: Mian Zeng, Guangdong (CN); Shu-Jhih Chen, Guangdong (CN)

(73) Assignee: Shenzhen China Star Optoelectronics Semiconductor Display Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 15/545,690

(22) PCT Filed: Jun. 23, 2017

(86) PCT No.: PCT/CN2017/089702
§ 371 (c)(1),
(2) Date: Jul. 22, 2017

(87) PCT Pub. No.: WO2018/218718
PCT Pub. Date: Dec. 6, 2018

(65) Prior Publication Data
US 2019/0103167 A1 Apr. 4, 2019

(30) Foreign Application Priority Data
Jun. 1, 2017 (CN) .......................... 2017 1 0404653

(51) Int. Cl.
G11C 19/00 (2006.01)
G11C 19/28 (2006.01)
G09G 3/36 (2006.01)

(52) U.S. Cl.
CPC ......... *G11C 19/287* (2013.01); *G09G 3/3677* (2013.01); *G11C 19/28* (2013.01); *G09G 2310/0286* (2013.01); *G09G 2310/08* (2013.01)

(58) Field of Classification Search
CPC .............................. G11C 19/00; G11C 19/287
See application file for complete search history.

(56) References Cited

U.S. PATENT DOCUMENTS

| 5,859,630 A | 1/1999 | Huq |
| 6,937,687 B2 * | 8/2005 | Yu .......................... G11C 19/00 345/100 |

(Continued)

FOREIGN PATENT DOCUMENTS

| CN | 101937718 A | 1/2011 |
| CN | 101989463 A | 3/2011 |

*Primary Examiner* — Hai L Nguyen
(74) *Attorney, Agent, or Firm* — Andrew C. Cheng (57) ABSTRACT

The present disclosure relates to a bidirectional shift register unit, a bidirectional shift register, and a display panel, wherein the bidirectional shift register unit includes: an pull-up circuit is configured to transform first clock signals into scanning signals outputting at a current level, an pull-up control circuit is configured with a forward pull-up sub-circuit and a backward pull-up sub-circuit respectively configured to pull up a potential of a control end of the pull-up circuit when a forward scanning process or a backward scanning process is conducted, a pull-down circuit and a pull-down maintaining circuit are respectively configured to pull down and continuously pull down the potential of the control end of the pull-up circuit and the scanning signals outputting at the current level during a pull-down phase. As such, a bidirectional scanning process may be achieved.

20 Claims, 6 Drawing Sheets

(56) References Cited

U.S. PATENT DOCUMENTS

| | | | |
|---|---|---|---|
| 7,151,523 B2* | 12/2006 | Ohkawa | G09G 3/3688 |
| | | | 345/100 |
| 7,366,274 B2* | 4/2008 | Tseng | G11C 19/00 |
| | | | 377/64 |
| 7,649,971 B2 | 1/2010 | Kim et al. | |
| 8,902,212 B2* | 12/2014 | Huang | G11C 19/287 |
| | | | 345/100 |
| 8,937,614 B2 | 1/2015 | Otose et al. | |
| 9,378,842 B2 | 6/2016 | Lee et al. | |
| 2014/0118237 A1 | 5/2014 | Wang | |
| 2015/0310929 A1 | 10/2015 | Umezaki | |
| 2018/0190228 A1 | 7/2018 | Xu | |
| 2018/0218700 A1 | 8/2018 | Zeng | |

* cited by examiner

BIDIRECTIONAL SHIFT REGISTER UNITS, BIDIRECTIONAL SHIFT REGISTERS, AND DISPLAY PANELS

BACKGROUND

1. Technical Field

The present disclosure relates to display field, and particularly to a bidirectional shift register unit, a bidirectional shift register and a display panel.

2. Description of Related Art

Conventionally, the shift register of the liquid crystal display panels may include a plurality of shift register units serially connected, and each of the scanning lines may connect with one shift register unit. The shift register may output the single pulse signals to the scanning lines line by line so as to perform the scanning process line by line.

Figure 1:
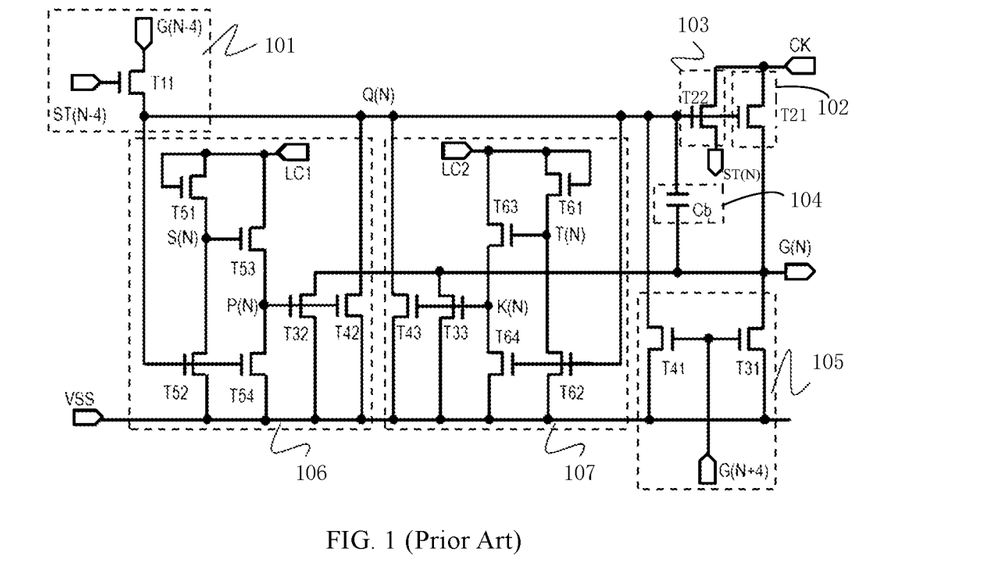
FIG. 1 is a circuit diagram of a conventional 8CK shift register.

The conventional shift register may only perform the scanning process along a particular direction, which lacks of flexibility. FIG. 1 is an example illustrating the 8CK shift register circuit of the eight clock signals of The shift register unit at N-th level is configured to charge the N-th horizontal scanning line G(N) within the display area. The shift register unit at N-th level may include: a pull-up control circuit 101, a pull-up circuit 102, a down-transfer circuit 103, a bootstrap capacitor 104, a pull-down circuit 105, a first pull-down maintaining circuit 106, and a second pull-down maintaining circuit 107. Due to the sequential relationship between the input signals of the pull-up control circuit 101, the pull-up circuit 102, and the pull-down circuit 105 when the circuit is operating, the 8CK shift register circuit may only conduct the scanning process along one single direction, which lacks of flexibility.

SUMMARY

The present disclosure relate to a bidirectional shift register unit, a bidirectional shift register, and a display panel In one aspect, the present disclosure relate to a bidirectional shift register unit, including: a pull-up circuit configured to transform first clock signals into scanning signals outputting at a current level; a pull-up control circuit configured with a forward pull-up sub-circuit and a backward pull-up sub-circuit, wherein the forward pull-up sub-circuit is configured to pull up a potential of a control end of the pull-up circuit when conducting a forward scanning process, and the backward pull-up sub-circuit is configured to pull up the potential of the control end of the pull-up circuit when conducting a backward scanning process; a pull-down circuit configured to pull down the potential of the control end of the pull-up circuit and the scanning signals outputting at the current level during a pull-down phase; a pull-down maintaining circuit configured to continuously pull down the potential of the control end of the pull-up circuit and the scanning signals outputting at the current level during the pull-down phase; wherein the pull-down circuit includes a first pull-down circuit and a second pull-down circuit; the first pull-down circuit is configured to pull down the potential of the scanning signals outputting at the current level during the pull-down phase; the second pull-down circuit is configured with a forward pull-down sub-circuit and a backward pull-down sub-circuit, wherein the forward pull-down sub-circuit is configured to pull down the potential of the control end of the pull-up circuit during the pull-down phase of the forward scanning process, and the backward pull-down sub-circuit is configured to pull down the potential of the control end of the pull-up circuit during the pull-down phase of the backward scanning process; the pull-down maintaining circuit includes a first pull-down maintaining sub-circuit and a second pull-down maintaining sub-circuit, wherein the first pull-down maintaining sub-circuit and the second pull-down maintaining sub-circuit are configured to continuously pull down the potential of the control end of the pull-up circuit and the scanning signals outputting at the current level during the pull-down phase according to fifth control signals and sixth control signals respectively; wherein phases of the fifth control signals and the sixth control signals are complementary, and the potential of the fifth control signals and the sixth control signals change for each predetermined time interval In another aspect, the present disclosure relate to a bidirectional shift register, including: a plurality of shift register units serially connected, wherein the shift register unit is configured with: a pull-up circuit configured to transform first clock signals into scanning signals outputting at a current level; a pull-up control circuit configured with a forward pull-up sub-circuit and a backward pull-up sub-circuit, wherein the forward pull-up sub-circuit is configured to pull up a potential of a control end of the pull-up circuit when a forward scanning process is conducted, and the backward pull-up sub-circuit is configured to pull up the potential of the control end of the pull-up circuit when a backward scanning process is conducted; a pull-down circuit configured to pull down the potential of the control end of the pull-up circuit and the scanning signals outputting at the current level during a pull-down phase; a pull-down maintaining circuit configured to continuously pull down the potential of the control end of the pull-up circuit and the scanning signals outputting at the current level during the pull-down phase; wherein a number of the first clock signals is configured to be m, first control signals of the register units located prior to (m+1)-th level is configured to be first initial signals (STV_F), fourth control signals of the register units located prior to the (m+1)-th level is configured to be second initial signals (STV_R); and second control signals of the register units located behind the (m−1)-th level is configured to be the second initial signals (STV_R), third control signals of the register units located behind the (m−1)-th level is configured to be first initial signals (STV_F).

In another aspect, the present disclosure relates to a display panel, including: a bidirectional shift register configured with a plurality of bidirectional shift register units serially connected, wherein the bidirectional shift register unit includes: a pull-up circuit configured to transform first clock signals into scanning signals outputting at a current level; a pull-up control circuit configured with a forward pull-up sub-circuit and a backward pull-up sub-circuit, wherein the forward pull-up sub-circuit is configured to pull up a potential of a control end of the pull-up circuit when a forward scanning process is conducted, and the backward pull-up sub-circuit is configured to pull up the potential of the control end of the pull-up circuit when a backward scanning process is conducted; a pull-down circuit configured to pull down the potential of the control end of the pull-up circuit and the scanning signals outputting at the current level during a pull-down phase; a pull-down maintaining circuit configured to continuously pull down the potential of the control end of the pull-up circuit and the scanning signals outputting at the current level during the pull-down phase; wherein a number of the first clock signals is configured to be m, first control signals of the register units located prior to (m+1)-th level is configured to be first initial signals (STV_F), fourth control signals of the register units located prior to the (m+1)-th level is configured to be second initial signals (STV_R); and second control signals of the register units located behind (m−1)-th level is configured to be the second initial signals (STV_R), third control signals of the register units located behind the (m−1)-th level is configured to be first initial signals (STV_F).

In view of the above, the bidirectional shift register unit may adopt the forward pull-up sub-circuit and the backward pull-up circuit to pull up the potential of the control end of the pull-up circuit when conducting the forward scanning process and the backward scanning process respectively. The bidirectional shift register unit may adopt the pull-down circuit to pull down the potential of the control end of the pull-up circuit and the scanning signals outputting at the current level during the pull-down phase. As such, the pull-up circuit may transform the clock signals into the scanning signals outputting at the current level when conducting the forward scanning process and the backward scanning process, so as to achieve the bidirectional scanning and to improve the flexibility of the circuit.

DETAILED DESCRIPTION

To clarify the purpose, technical solutions, and the advantages of the disclosure, embodiments of the invention will now be described more fully hereinafter with reference to the accompanying drawings, in which embodiments of the invention are shown. The figure and the embodiment described according to figure are only for illustration, and the present disclosure is not limited to these embodiments.

Figure 2:
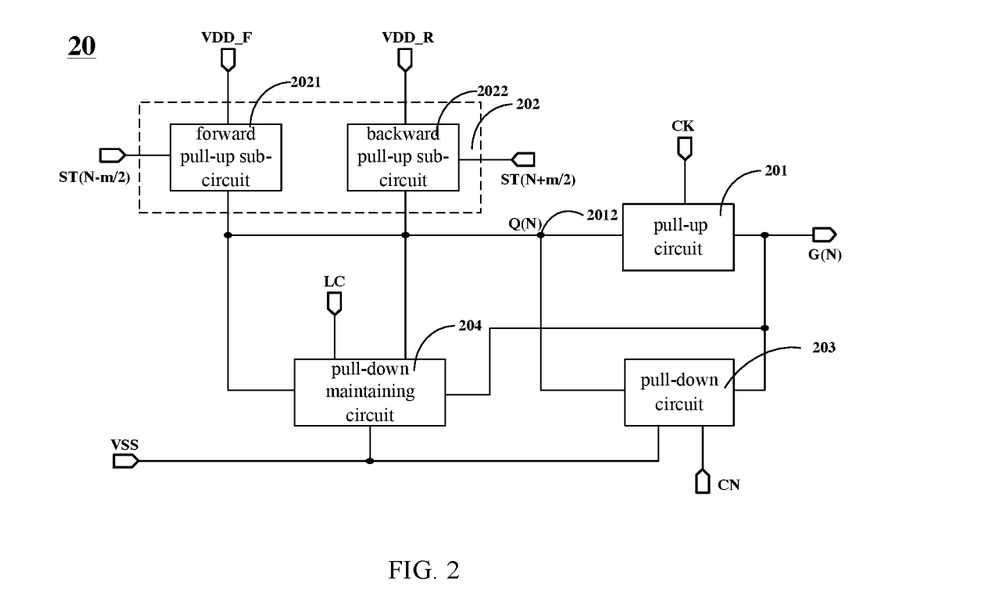
FIG. 2 is a circuit diagram of a bidirectional shift register unit in one embodiment of the present disclosure.

As shown in FIG. 2, the present disclosure relates to a bidirectional shift register unit 20, including: a pull-up circuit 201, a pull-up control circuit 202, a pull-down circuit 203, and a pull-down maintaining circuit 204.

The pull-up circuit 201 is configured to transform first clock signals CK into scanning signals G(N) outputting at a current level.

The pull-up control circuit 202 is configured with a forward pull-up sub-circuit 2021 and a backward pull-up sub-circuit 2022. The forward pull-up sub-circuit 2021 is configured to pull up a potential of a control end 2012 of the pull-up circuit 201 when conducting a forward scanning process, and the backward pull-up sub-circuit 2022 is configured to pull up the potential of the control end 2012 of the pull-up circuit 201 when conducting a backward scanning process.

The pull-down circuit 203 is configured to pull down the potential of the control end 2012 of the pull-up circuit 201 and the scanning signals G(N) outputting at the current level during a pull-down phase.

The pull-down maintaining circuit 204 is configured to continuously pull down the potential of the control end 2012 of the pull-up circuit 201 and the scanning signals G(N) outputting at the current level during the pull-down phase.

Specifically, as shown in FIG. 2, it is an example illustrating a m-th of the first clock signals CK1~CKm. Input signals of the pull-up control circuit 201 are configured to be the first clock signals CK, and the input signals of the control end 2012 of the pull-up control circuit 201 are configured to be Q(N). In the pull-up control circuit 202, the input signals of the forward pull-up sub-circuit 2021 are forward voltage signals VDD_F, the input signals of the control end of the forward pull-up sub-circuit 2021 are configured to be first control signals ST(N−m/2), and the output signals of the forward pull-up sub-circuit 2021 are configured to control the potential of the control signals Q(N). The input signals of the backward pull-up sub-circuit 2022 are configured to be backward voltage signals VDD_R. The input signals of the control end of the backward pull-up sub-circuit 2022 are configured to be second control signals ST(N+m/2), and the output signals of the backward pull-up sub-circuit 2022 are configured to control the potential of the control signals Q(N). The input signals of the pull-down circuit 203 are configured to be low level signals VSS. The input signals of the control end of the pull-down circuit 203 are at least configured to be one CN, and the output signals of the pull-down circuit 203 are configured to pull down the potential of the control signals Q(N) and the scanning signals G(N). The input signals of the pull-down maintaining circuit 204 are configured to be the low level signals VSS. The input signals of the control end of the pull-down circuit 203 are configured to be at least one LC, and the output signals of the pull-down circuit 203 are configured to continuously pull down the potential of Q(N) and G(N) during the pull-down phase.

The potential of the control signals Q(N) is pulled up by the pull-up control circuit 202 and the pull-up circuit 201 transforms the first clock signals CK into the scanning signals G(N) outputting at the current level during the pull-up phase of the forward scanning process and the backward scanning process. The pull-down circuit 203 pulls down the potential of the control signals Q(N) and the potential of the scanning signals G(N), and the pull-down maintaining circuit 204 continuously pulls down the potential of the control signals Q(N) and the potential of the scanning signals G(N) during the pull-down phase. As such, the bidirectional shift register unit may output the correct scanning signals G(N) at the current level when conducting the forward scanning process and the backward scanning process, so as to achieve the bidirectional scanning and to improve flexibility of the circuit.

Figure 3:
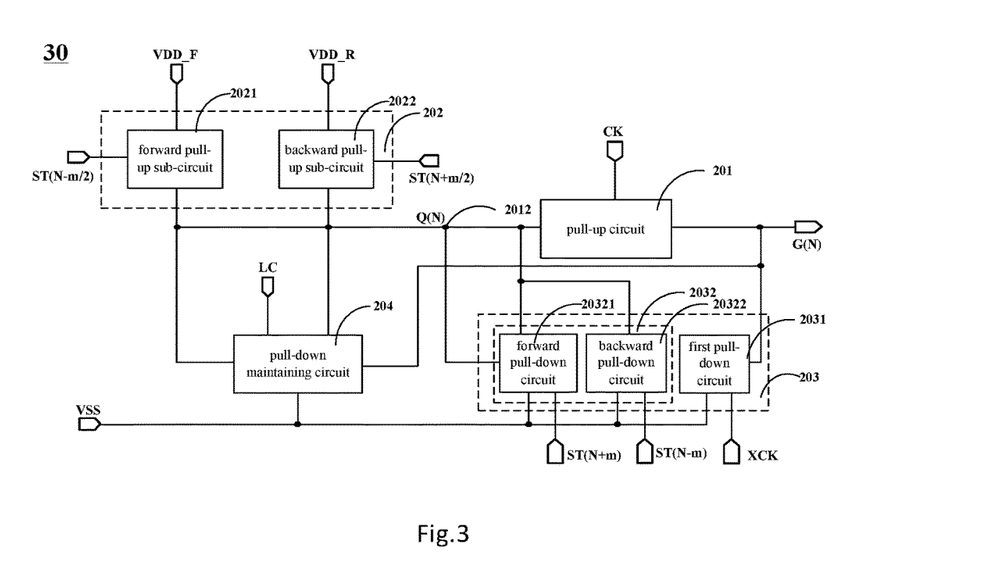
FIG. 3 is a circuit diagram of a bidirectional shift register unit in another embodiment of the present disclosure.

In another aspect, as shown in FIG. 3, the present disclosure relates to a bidirectional shift register 30 basing on the bidirectional shift register unit shown in FIG. 2. The pull-down circuit 203 may further include a first pull-down circuit 2031 and a second pull-down circuit 2032. The remaining portions of the bidirectional shift register 30 of the embodiment are the same with the circuit shown in FIG. 2, and may not be described again.

The first pull-down circuit 2031 is configured to pull down the potential of the scanning signals G(N) outputting at the current level during the pull-down phase.

The second pull-down circuit 2032 is configured with a forward pull-down sub-circuit 20321 and a backward pull-down sub-circuit 20322, wherein the forward pull-down sub-circuit 20321 is configured to pull down the potential of the control end 2012 of the pull-up circuit 201 during the pull-down phase of the forward scanning process, and the backward pull-down sub-circuit 20322 is configured to pull down the potential of the control end 2012 of the pull-up circuit 201 during the pull-down phase of the backward scanning process.

Specifically, as shown in FIG. 3, it is an example illustrating the m-th of the first clock signals CK1~CKm. The input signals of the first pull-down circuit 2031, the forward pull-down sub-circuit 20321, and the backward pull-down sub-circuit 20322 are configured to be the low level signals VSS. The input signals of the control end of the first pull-down circuit 2031 are configured to be second clock signals XCK, and the output signals of the first pull-down circuit 2031 are configured to control the potential of the scanning signals G(N) outputting at the current level. The input signals of the control end of the forward pull-down sub-circuit 20321 is configured to be third control signals ST(N+m), and the output signals of the forward pull-down sub-circuit 20321 are configured to control the potential of the control signals Q(N). The input signals of the control end of the backward pull-down sub-circuit 20322 is configured to be fourth control signals ST(N−m), and the output signals of the backward pull-down sub-circuit 20322 are configured to control the potential of the control signals Q(N).

The potential of the scanning signals G(N) may be pulled down by the first pull-down circuit 2031 and the potential of the control signals Q(N) may be pulled down by the forward pull-down sub-circuit 20321 during the pull-down phase of the forward scanning process. The potential of the scanning signals G(N) may be pulled down by the first pull-down circuit 2031 and the potential of the control signals Q(N) may be pulled down by the backward pull-down sub-circuit 20322 during the pull-down phase of the backward scanning process. As such, the bidirectional scanning may be achieved, and the flexibility of the circuit may be improved.

Figure 4:
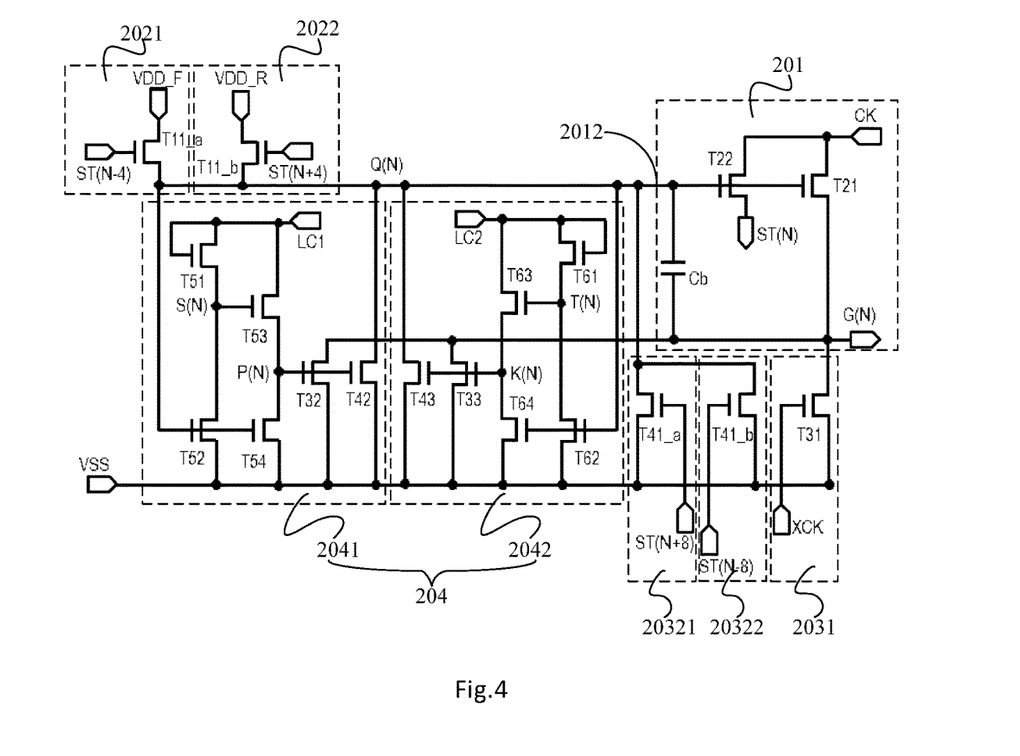
FIG. 4 is a circuit diagram of a bidirectional shift register unit in one embodiment of the present disclosure.

In one example, FIG. 4 is an example illustrating the m-th of the first clock signals CK1~CKm. The forward pull-up sub-circuit 2021 further includes a first transistor T11_a, wherein a control end of the first transistor T11_a couples with first control signals ST(N−m/2), an input end of the first transistor T11_a couples with forward voltage signals VDD_F, and an output end of the first transistor T11_a couples with the control end 2012 of the pull-up circuit 201.

The backward pull-up sub-circuit 2022 further includes a second transistor T11_b, wherein a control end of the second transistor T11_b couples with the second control signals ST(N+m/2), an input end of the second transistor T11_b couples with the backward voltage signals VDD_R, and an output end of the second transistor T11_b couples with the control end 2012 of the pull-up circuit 201.

The forward voltage signals VDD_F are configured to be high level signals VGH and the backward voltage signals VDD_R are configured to be the low level signals VSS when conducting the forward scanning process, and the forward voltage signals VDD_F are configured to be the low level signals VSS and the backward voltage signals VDD_R are the high level signals VGH when conducting the backward scanning process.

As shown in FIG. 4, the pull-down circuit 203 may include the first pull-down circuit 2031 and the second pull-down circuit 2032, wherein the first pull-down circuit 2031 is configured with a third transistor T31. A control end of the third transistor T31 couples with the second clock signals XCK, an input end of the third transistor T31 couples with the low level signals VSS, and an output end of the third transistor T31 couples with the control end of the scanning signals G(N) outputting at the current level. The second pull-down circuit 2032 may include the forward pull-down sub-circuit 20321 and the backward pull-down sub-circuit 20322.

The forward pull-down sub-circuit 20321 may include a fourth transistor T41_a, wherein a control end of the fourth transistor T41_a couples with the third control signals ST(N+m), an input end of the fourth transistor T41_a couples with the low level signals VSS, and an output end of the fourth transistor T41_a couples with the control end 2012 of the pull-up circuit 201. The backward pull-down sub-circuit 20322 may include a fifth transistor T41_b, wherein a control end of the fifth transistor T41_b couples with the fourth control signals ST(N−m), an input end of the fifth transistor T41_b couples with the low level signals VSS, and an output end of the fifth transistor T41_b couples with the control end 2012 of the pull-up circuit 201. And phases of the second clock signals and the first clock signals are complementary.

The pull-up circuit 201 at least includes a sixth transistor T21 and a bootstrap capacitor Cb, wherein a control end of the sixth transistor T21 couples with the pull-up control circuit 202, the pull-down circuit 203, and the pull-down maintaining circuit 204, an input end of the sixth transistor T21 couples with the first clock signals CK, and an output end of the sixth transistor T21 couples with the scanning signals G(N) outputting at the current level. As shown in FIG. 2, the control end of the sixth transistor T21 respectively couples with the output end of the transistor T11_a, the transistor T11_b, the transistor T41_a, the transistor T41_b, the transistor T42, the transistor T43 and the control end of the transistor T52, the transistor T54, the transistor T62, the transistor T64.

The bootstrap capacitor Cb couples between the control end and the output end of the sixth transistor T21, and the bootstrap capacitor Cb is configured to pull up the potential of the control signals Q(N) of the control end of the sixth transistor T21.

As shown in FIG. 4, the pull-up circuit 201 further includes a seventh transistor T22, wherein a control end of the seventh transistor T22 couples with the control end of the sixth transistor T21, an input end of the seventh transistor T22 couples with the first clock signals CK, and an output end of the seventh transistor T22 couples with down-transfer signals ST(N) at the current level. The pull-up circuit 201 is further configured to transform the first clock signals CK into the down-transfer signals ST(N).

The pull-down maintaining circuit 204 includes a first pull-down maintaining sub-circuit 2041 and a second pull-down maintaining sub-circuit 2042, wherein the first pull-down maintaining sub-circuit 2041 and the second pull-down maintaining sub-circuit 2042 are configured to continuously pull down the potential of the control end 2012 of the pull-up circuit 201 and the scanning signals G(N) outputting at the current level during the pull-down phase according to fifth control signals LC1 and sixth control signals LC2 respectively. Phases of the fifth control signals LC1 and the sixth control signals LC2 are complementary, and the potential of the fifth control signals LC1 and the sixth control signals LC2 change for each 100 frames. Frequency of the fifth control signals LC1 and the sixth control signals LC2 is less than the first clock signals CK inputted to the pull-up circuit 201. In another example, the potential changing time period for the control signals LC1 and LC2 may be 10 frames or 20 frames, but is not limited.

As shown in FIG. 4, the first pull-down maintaining circuit 2041 may further include: an eighth transistor T42, a tenth transistor T32, a twelfth transistor T54, a fourteenth transistor T52, a sixteenth transistor T53, and a eighteenth transistor T51. The second pull-down circuit 2042 may further include: a ninth transistor T43, a eleventh transistor T33, a thirteenth transistor T64, a fifteenth transistor T62, a seventeenth transistor T63, and a nineteenth transistor T61 symmetrically configured on an opposite side of the first pull-down maintaining circuit 2041. Input ends of the tenth transistor T32, the eleventh transistor T33, the eighth transistor T42, the ninth transistor T43, the fourteenth transistor T52, the twelfth transistor T54, the fifteenth transistor T62, and the thirteenth transistor T64 couple with the low level signals VSS. Output ends of the eighth transistor T42 and the ninth transistor T43 couple with the control end of the seventh transistor T22 and an output end of the tenth transistor T32. The eleventh transistor T33 couple with the scanning signals G(N) outputting at the current level. Control ends of the fourteenth transistor T52, the twelfth transistor T54, the fifteenth transistor T62, and the thirteenth transistor T64 couple with the control end of the seventh transistor T22. A control end of the eighth transistor T42, a control end of the tenth transistor T32, a output end of the twelfth transistor T54, and a output end of the sixteenth transistor T53 couple with a first control point P(N). A control end of the ninth transistor T43, a control end of the eleventh transistor T33, a output end of the thirteenth transistor T64, and a output end of the seventeenth transistor T63 couple with a second control point K(N). A output end of the fourteenth transistor T52, a output end of the eighteenth transistor T51, and a control end of the sixteenth transistor T53 couple with a third control point S(N). A output end of the fifteenth transistor T62, a output end of the nineteenth transistor T61, and a control end of the seventeenth transistor T63 couple with a fourth control point T(N). An input end of the eighteenth transistor T51, a control end of the eighteenth transistor T51, and an input end of the sixteenth transistor T53 couple with the fifth control signals LC1. An input end of the nineteenth transistor T61, a control end of the nineteenth transistor T61, and an input end of the seventeenth transistor T63 couple with the sixth control signals LC2.

Figure 5:
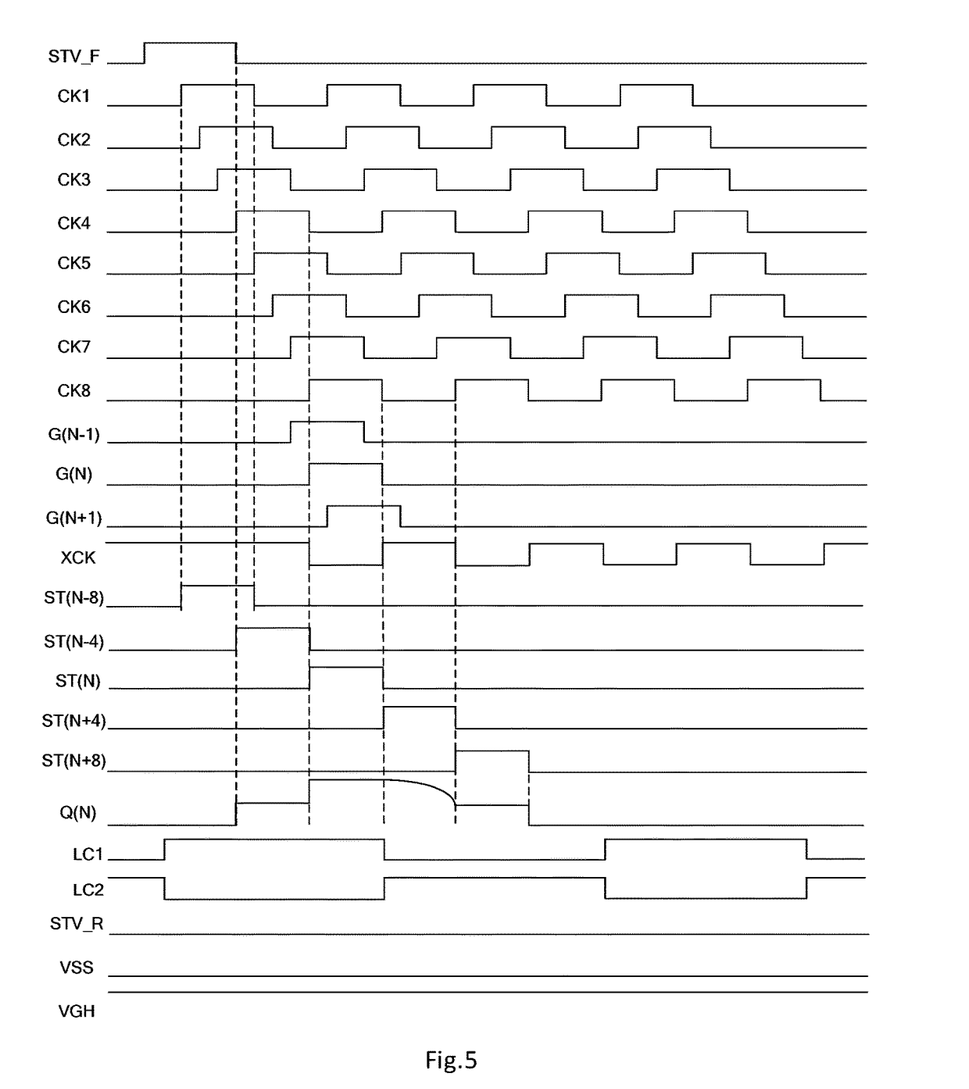
FIG. 5 is an operation waveform timing diagram when conducting a forward scanning process shown in FIG. 4.

As shown in FIG. 4 and FIG. 5, an example illustrating eight of the first clock signals CK1~CK8 and the first clock signals inputting at the current level is CK8. When the bidirectional shift register is conducting the forward scanning process, the input signals VDD_F of the input end 20211 of the forward pull-up circuit 2021 is the high level signals VGH, and the input signals VDD_R of the input end 20221 of the backward pull-up circuit 2022 is the low level signals VSS. When the first control signals ST(N−4) transits to the high level, the transistor T11_a turns on, the high level signals VGH pull up the potential of the control end 2012 of the pull-up circuit 201, i.e., the control signals Q(N) is at the high level. Upon entering to the pull-up phase, the transistor T21 turns on, the first clock signals CK8 is at the low level, the scanning signals G(N) outing at the current level is also at the low level, and thus a voltage difference exists between two side of the bootstrap capacitor Cb and is configured to charge the bootstrap capacitor Cb. When the first clock signals transits to the high level, the first control signals ST(N−4) and the second control signals become the low level, the transistor T11_a and the transistor T11_b turn off, the transistor T21 and the transistor T22 turn on, and the scanning signals G(N) outputting at the current level and the down-transfer signals ST(N) are at the high level. The bootstrap capacitor Cb may further pull up the potential Q(N) to guarantee the first clock signals CK8 is at the high level phase. The transistor T21 and the transistor T22 are in an opened state, such that the scanning signals G(N) outputting at the current level and the down-transfer signals ST(N) may be also at the high level. As such, the scanning signals G(N) outputting at the current level may output normally.

During the pull-up phase, the control signals Q(N) is at the high level, the transistor T52, the transistor T54, the transistor T62, and the transistor T64 turn on, such that the first control point P(N), the second control point K(N), the third control end S(N), and the control end T(N) are pulled down by the low level signals VSS. The transistor T32, the transistor T33, the transistor T42, the transistor T43, the transistor T53, and the transistor T63 turn off, such that the pull-down maintaining circuit 204 may have no influence on the potential of the control signals Q(N) and the scanning signals G(N) during the pull-up phase.

When the first clock signals CK8 transits to low level, the complementary signals XCK become the high level, and the transistor T31 turns on. Upon turning into the pull-down phase, the scanning signals G(N) outputting at the current level is pulled down by the low level signals VSS, and the bootstrap capacitor Cb discharges, causing the potential of the control signals Q(N) to decline. When the third control signals ST(N+8) transits to the high level, the transistor T41_a turns on, and the potential of the control signals Q(N) is pulled down by the low level signals VSS. The pull-down maintaining circuit 204 begins to operate, and the sixth control signals LC2 is at the high level. In the second pull-down maintaining circuit 2042, the transistor T61 turns on, and the potential of the fourth control point T(N) is pulled up. The transistor T63 turns on, the potential of the second control point K(N). The transistor T33 and the transistor T43 turn on, and the control signals Q(N) of the control end 2012 of the pull-up circuit 201 and the potential of the scanning signals G(N) outputting at the current level are continuously pulled down by the low level signals VSS. When the fifth control LC1 transits to the high level, the first pull-down maintaining circuit 2041 begins to operate. The operation process is similar to the second pull-down maintaining circuit 2042, and may not be described again.

Figure 6:
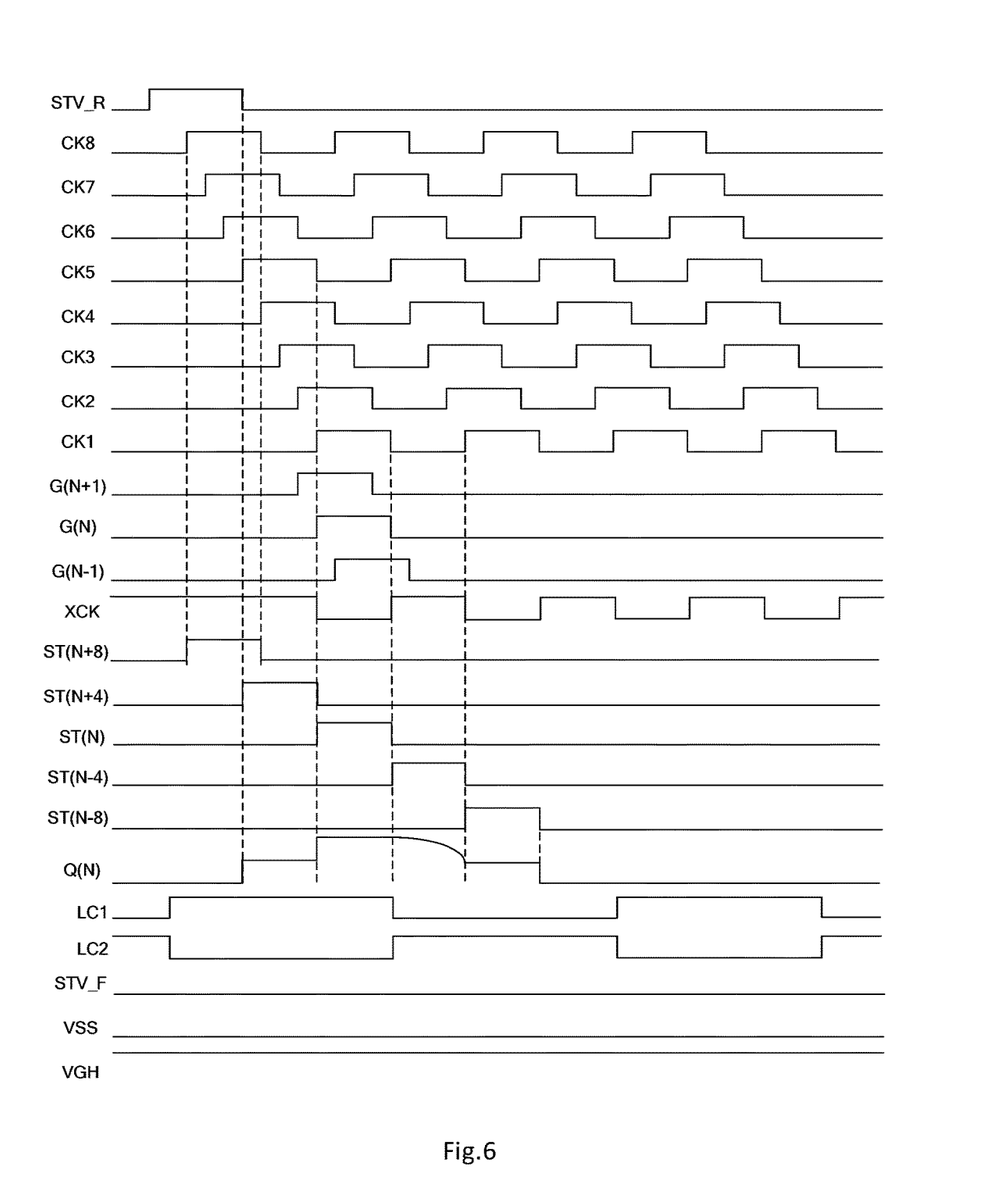
FIG. 6 is an operation waveform timing diagram when conducting a backward scanning process shown in FIG. 4.

As shown in FIG. 4 and FIG. 6, the example illustrating eight of the first clock signals CK1~CK8 and the first clock signals inputting at the current level is CK8. When the bidirectional shift register is conducting the backward scanning process, the input signals VDD_F of the input end 20211 of the forward pull-up circuit 2021 is the low level signals VSS, and the input signals VDD_R of the input end 20221 of the backward pull-up circuit 2022 is the high level signals VGH. When the second control signals ST(N+4) transits to the high level, the transistor T11_b turns on, the high level signals VGH pull up the potential of the control end 2012 of the pull-up circuit 201, i.e., the control signals Q(N) is at the high level. Upon turning into the pull-up phase, the transistor T21 turns on, the first clock signals CK1 is at the low level, the scanning signals G(N) outing at the current level is also at the low level, and thus the voltage difference exists between the two side of the bootstrap capacitor Cb and is configured to charge the bootstrap capacitor Cb. When the first clock signals transits to the high level, the second control signals ST(N+4) and the second control signals become the low level, the transistor T11_a and the transistor T11_b turn off, the transistor T21 and the transistor T22 turn on, and the scanning signals G(N) outputting at the current level and the down-transfer signals ST(N) are at the high level. The bootstrap capacitor Cb may further pull up the potential of the control signals Q(N) to guarantee the first clock signals CK1 is at the high level phase. The transistor T21 and the transistor T22 are in the opened state, such that the scanning signals G(N) outputting at the current level and the down-transfer signals ST(N) may be also at the high level. As such, the scanning signals G(N) outputting at the current level may output normally.

During the pull-up phase, the control signals Q(N) is at the high level, the transistor T52, the transistor T54, the transistor T62, and the transistor T64 turn on, such that the first control point P(N), the second control point K(N), the third control end S(N), and the control end T(N) are pulled down by the low level signals VSS. The transistor T32, the transistor T33, the transistor T42, the transistor T43, the transistor T53, and the transistor T63 turn off, such that the pull-down maintaining circuit 204 may have no influence on the potential of the control signals Q(N) and the scanning signals G(N) during the pull-up phase.

When the first clock signals CK1 transits to the low level, the complementary signals XCK become the high level, and the transistor T31 turns on. Upon entering to the pull-down phase, the scanning signals G(N) outputting at the current level is pulled down by the low level signals VSS, and the bootstrap capacitor Cb discharges, causing the potential of the control signals Q(N) to decline. When the fourth control signals ST(N−8) transits to the high level, the transistor T41_a turns on, and the potential of the control signals Q(N) is pulled down by the low level signals VSS. The pull-down maintaining circuit 204 begins to operate, and the sixth control signals LC2 is at the high level. In the second pull-down maintaining circuit 2042, the transistor T61 turns on, and the potential of the fourth control point T(N) is pulled up. The transistor T63 turns on, the potential of the second control point K(N). The transistor T33 and the transistor T43 turn on, and the control signals Q(N) of the control end 2012 of the pull-up circuit 201 and the potential of the scanning signals G(N) outputting at the current level are continuously pulled down by the low level signals VSS. When the fifth control LC1 transits to the high level, the first pull-down maintaining circuit 2041 begins to operate. The operation process is similar to the second pull-down maintaining circuit 2042, and may not be described again.

During the forward scanning process and the backward scanning process, the potential of the control signals LC1 and the control signals LC2 alternately change. As such the first pull-down maintaining sub-circuit 2041 and the second pull-down maintaining sub-circuit 2042 may operate alternately to continuously pull down the potential of the control signals Q(N) of the signal point and the potential of the scanning signals G(N) outputting the horizontal scanning lines, and the negative influences of the transistors caused by staying under a DC stress state for a long period may be reduced.

In one example, the transistors may be thin film transistors (TFTs). The control end of the TFT may be a gate, the input end of the TFT may be a source, and the output end of the TFT may be a drain. In another example, the input end of the TFT may be the drain, and the output end of the TFT may be the source. In another example, the transistor may be in other types, but is not limited.

Figure 7:
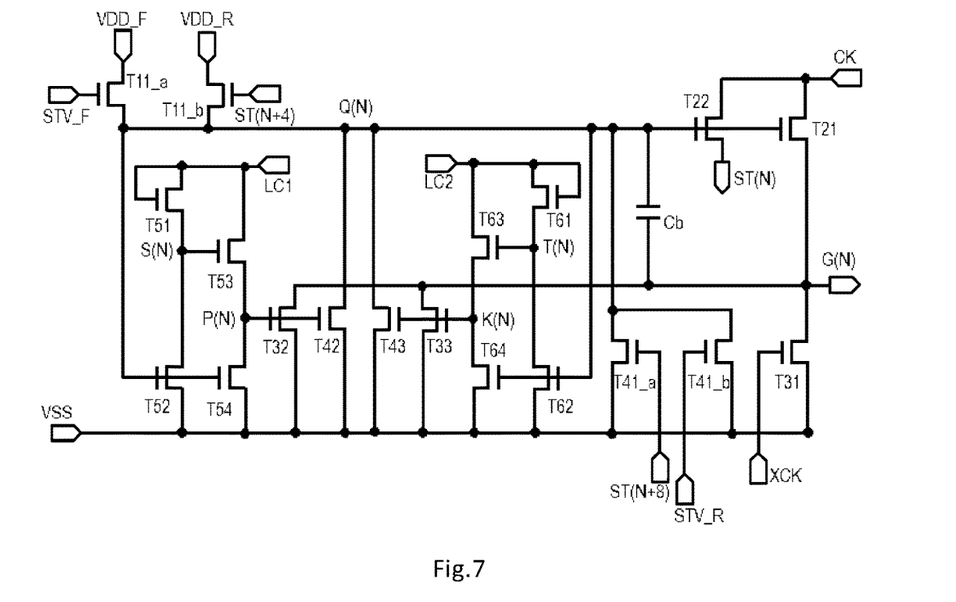
FIG. 7 is a circuit diagram illustrating the circuit adopted in a bidirectional shift register located prior to (m+1)-th level.

The bidirectional shift register unit may be adopted in the bidirectional shift register. The bidirectional shift register includes a plurality of shift register units serially connected in a sequence having a head and a tail. The m number of bidirectional shift register units counting along a direction from the head to the tail are classified as a first group, and the m number of the bidirectional shift register units counting along the direction from the tail to the head are classified as a second group. The first control signals ST(N−m/2) of the bidirectional shift register units in the first group and the fourth control signals ST(N−m) may not exist. Therefore, as shown in FIG. 7, the first control signals of the bidirectional shift register units located prior to (m+1)-th level may adopt the first initial signals (STV_F), and the fourth control signals of the bidirectional shift register units located prior to the (m+1)-th level may adopt the second initial signals (STV_R). Similarly, the second control signals of the bidirectional shift register units located behind (m−1)-th level may adopt the second initial signals (STV_R), and the third control signals of the bidirectional shift register units located behind the (m−1)-th level may adopt the first initial signals (STV_F). The operation process of the circuit shown in FIG.7 and FIG. 8 may be reference to the operation process of the circuit shown in FIG.4, and may not be described again.

In view of the above, the bidirectional shift register unit in the present disclosure may adopt the forward pull-up sub-circuit and the backward pull-up circuit to pull up the potential of the control end of the pull-up circuit when conducting the forward scanning process and the backward scanning process respectively. The bidirectional shift register unit may adopt the pull-down circuit to pull down the potential of the control end of the pull-up circuit and the scanning signals outputting at the current level during the pull-down phase. As such, the pull-up circuit may transform the clock signals into the scanning signals outputting at the current level when conducting the forward scanning process and the backward scanning process, so as to achieve the bidirectional scanning and to improve the flexibility of the circuit.

Figure 9:
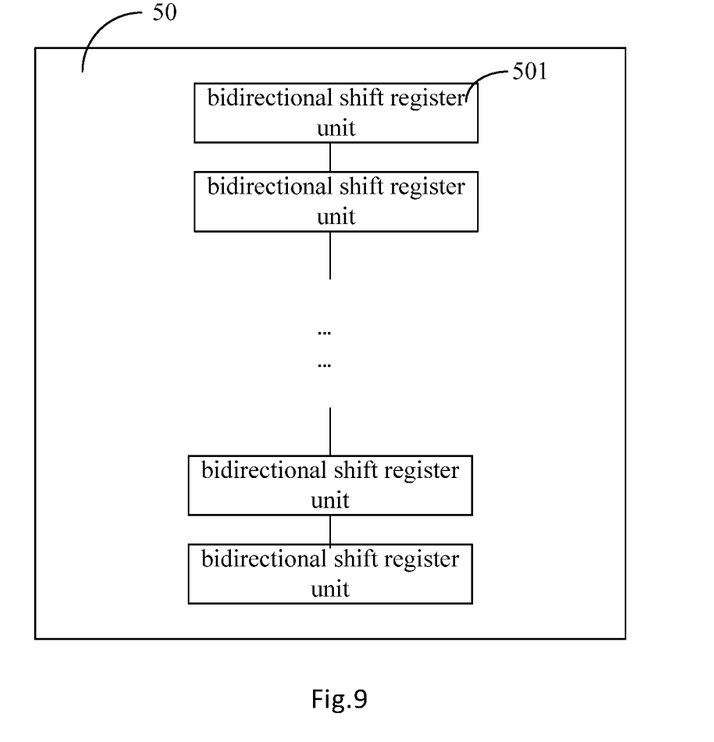
FIG. 9 is a schematic diagram of a bidirectional shift register in one embodiment of the present disclosure.

In another aspect, as shown in FIG. 9, the present disclosure further relates to a bidirectional shift register 50, including: a plurality of the bidirectional shift register units 501. The bidirectional shift register unit 501 may be reference to the bidirectional shift register unit shown in FIG. 2 or FIG. 3, the circuit structure of the bidirectional shift register unit 501 may be reference to the circuit structure shown in FIG. 4, and may not be described again. But the number of the bidirectional shift register unit 501 is not limited in the present disclosure.

Figure 8:
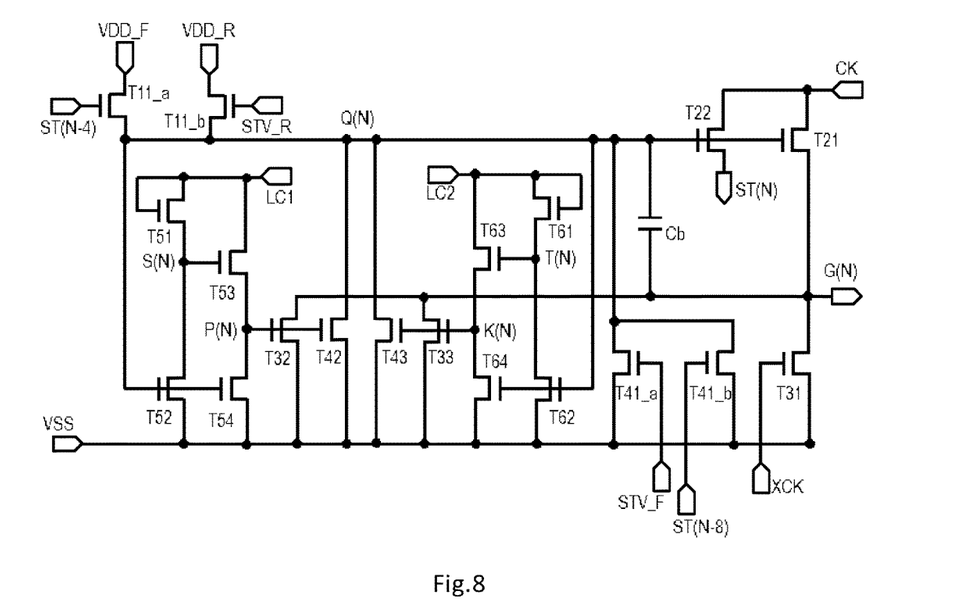
FIG. 8 is a circuit diagram illustrating the circuit adopted in a bidirectional shift register located behind (m−1)-th level.

Specifically, as shown in FIG. 7 and FIG. 8, it is another example illustrating the m-th of the first clock signals CK1~CKm. The first control signals of the bidirectional shift register units 501 located prior to the (m+1)-th level is configured to be the first initial signals STV_F, the fourth control signals of the bidirectional shift register units 501 located prior to the (m+1)-th level is configured to be the second initial signals STV_R. The second control signals of the bidirectional shift register units 501 located behind the (m−1)-th level is configured to be the second initial signals STV_R, and the third control signals of the bidirectional shift register units 501 located behind the (m−1)-th level is configured to be the first initial signals STV_F. The circuit structure of the bidirectional shift register unit 501 at each of the middle levels and the control signals may be reference to FIG. 4, and may not be described again. The number of the first clock signals may not be limited in the present disclosure.

The operation process of the bidirectional shift register units 501 located prior to the (m+1)-th level and the bidirectional shift register units 501 located behind the (m−1)-th level may be reference to FIG. 4, and may not be described again.

In view of the above, the bidirectional shift register may include a plurality of the bidirectional shift register units. Each of the bidirectional shift register units may adopt the forward pull-up sub-circuit and the backward pull-up circuit to pull up the potential of the control end of the pull-up circuit when conducting the forward scanning process and the backward scanning process respectively. The bidirectional shift register unit may adopt the pull-down circuit to pull down the potential of the control end of the pull-up circuit and the scanning signals outputting at the current level during the pull-down phase. As such, the pull-up circuit may transform the clock signals into the scanning signals outputting at the current level when conducting the forward scanning process and the backward scanning process, so as to achieve the bidirectional scanning and to improve the flexibility of the circuit.

Figure 10:
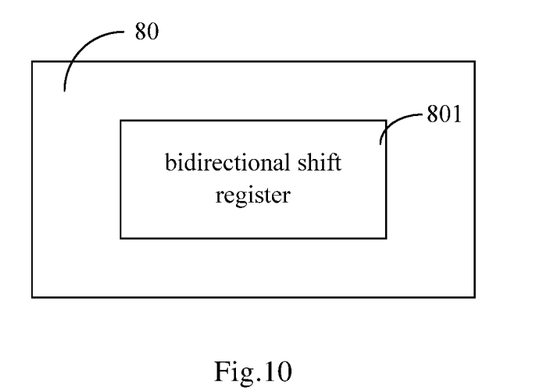
FIG. 10 is a schematic diagram of a display panel in one embodiment of the present disclosure.

In another aspect, the present disclosure relates to a display panel 80, at least including the bidirectional shift register 801. The structure and the operation process of the bidirectional shift register 801 may be reference to FIG. 9, and may not be described again.

In one example, the display panel may be a liquid crystal panel or a plasma panel, and may not be limited in the present disclosure.

In one example, the display panel 80 may further include a TFT substrate and a liquid crystal layer, and may not be limited in the present disclosure.

In view of the above, the display panel may include the bidirectional shift register configured with bidirectional shift register units. Each of the bidirectional shift register units may adopt the forward pull-up sub-circuit and the backward pull-up circuit to pull up the potential of the control end of the pull-up circuit when conducting the forward scanning process and the backward scanning process respectively. The bidirectional shift register unit may adopt the pull-down circuit to pull down the potential of the control end of the pull-up circuit and the scanning signals outputting at the current level during the pull-down phase. As such, the pull-up circuit may transform the clock signals into the scanning signals outputting at the current level when conducting the forward scanning process and the backward scanning process, so as to achieve the bidirectional scanning and to improve the flexibility of the circuit.

The above description is merely the embodiments in the present disclosure, the claim is not limited to the description thereby. The equivalent structure or changing of the process of the content of the description and the figures, or to implement to other technical field directly or indirectly should be included in the claim.

What is claimed is:

1. A bidirectional shift register unit, comprising:
    a pull-up circuit configured to transform first clock signals into scanning signals outputting at a current level;
    a pull-up control circuit configured with a forward pull-up sub-circuit and a backward pull-up sub-circuit, wherein the forward pull-up sub-circuit is configured to pull up a potential of a control end of the pull-up circuit when conducting a forward scanning process, and the backward pull-up sub-circuit is configured to pull up the potential of the control end of the pull-up circuit when conducting a backward scanning process;
    a pull-down circuit configured to pull down the potential of the control end of the pull-up circuit and the scanning signals outputting at the current level during a pull-down phase;
    a pull-down maintaining circuit configured to continuously pull down the potential of the control end of the pull-up circuit and the scanning signals outputting at the current level during the pull-down phase;
    wherein the pull-down circuit comprises a first pull-down circuit and a second pull-down circuit;
    the first pull-down circuit is configured to pull down the potential of the scanning signals outputting at the current level during the pull-down phase;
    the second pull-down circuit is configured with a forward pull-down sub-circuit and a backward pull-down sub-circuit, wherein the forward pull-down sub-circuit is configured to pull down the potential of the control end of the pull-up circuit during the pull-down phase of the forward scanning process, and the backward pull-down sub-circuit is configured to pull down the potential of the control end of the pull-up circuit during the pull-down phase of the backward scanning process;
    the pull-down maintaining circuit comprises a first pull-down maintaining sub-circuit and a second pull-down maintaining sub-circuit, wherein the first pull-down maintaining sub-circuit and the second pull-down maintaining sub-circuit are configured to continuously pull down the potential of the control end of the pull-up circuit and the scanning signals outputting at the current level during the pull-down phase according to fifth control signals and sixth control signals respectively;
    wherein phases of the fifth control signals and the sixth control signals are complementary, and the potential of the fifth control signals and the sixth control signals change for each predetermined time interval.

2. The bidirectional shift register unit according to claim 1, wherein the forward pull-up sub-circuit further comprises a first transistor, a control end of the first transistor couples with first control signals, an input end of the first transistor couples with forward voltage signals, and an output end of the first transistor couples with the control end of the pull-up circuit;
    the backward pull-up sub-circuit further comprises a second transistor;
    a control end of the second transistor couples with second control signals, an input end of the second transistor couples with the backward voltage signals, and an output end of the second transistor couples with the control end of the pull-up circuit;
    wherein the forward voltage signals are configured to be high level signals and the backward voltage signals are configured to be low level signals when conducting the forward scanning process, the forward voltage signals are configured to be low level signals and the backward voltage signals are high level signals when conducting the backward scanning process.

3. The bidirectional shift register unit according to claim 2, wherein the first pull-down circuit comprises a third transistor, a control end of the third transistor couples with second clock signals, an input end of the third transistor couples with the low level signals, and an output end of the third transistor couples with the control end of the scanning signals outputting at the current level;

the forward pull-down sub-circuit comprises a fourth transistor, a control end of the fourth transistor couples with third control signals, an input end of the fourth transistor couples with the low level signals, and an output end of the fourth transistor couples with the control end of the pull-up circuit;

the backward pull-down sub-circuit comprises a fifth transistor, a control end of the fifth transistor couples with fourth control signals, an input end of the fifth transistor couples with the low level signals, and an output end of the fifth transistor couples with the control end of the pull-up circuit;

wherein phases of the second clock signals and the first clock signals are complementary.

4. The bidirectional shift register unit according to claim 3, wherein the pull-up circuit at least comprises a sixth transistor and a bootstrap capacitor, a control end of the sixth transistor couples with the pull-up control circuit, the pull-down circuit, and the pull-down maintaining circuit, an input end of the sixth transistor couples with the first clock signals, and an output end of the sixth transistor couples with the scanning signals outputting at the current level;

the bootstrap capacitor couples between the control end and the output end of the sixth transistor, and the bootstrap capacitor is configured to pull up the potential of the control end of the sixth transistor;

the pull-up circuit further comprises a seventh transistor, a control end of the seventh transistor couples with the control end of the sixth transistor, an input end of the seventh transistor couples with the first clock signals, and an output end of the seventh transistor couples with down-transfer signals at the current level, wherein the pull-up circuit is further configured to transform the first clock signals into the down-transfer signals;

a number of the first clock signals is configured to be m, the down-transfer signals of the register unit at the N-th level is configured to be ST(N), the first control signals of the register unit at the N-th level is configured to be ST(N−m/2), the second control signals of the register unit at the N-th level is configured to be ST(N+m/2), the third control signals of the register unit at the N-th level is configured to be ST(N−m), the fourth control signals of the register unit at the N-th level is configured to be ST(N+m).

5. A bidirectional shift register, comprising a plurality of shift register units serially connected, wherein the shift register unit is configured with:

a pull-up circuit configured to transform first clock signals into scanning signals outputting at a current level;

a pull-up control circuit configured with a forward pull-up sub-circuit and a backward pull-up sub-circuit, wherein the forward pull-up sub-circuit is configured to pull up a potential of a control end of the pull-up circuit when a forward scanning process is conducted, and the backward pull-up sub-circuit is configured to pull up the potential of the control end of the pull-up circuit when a backward scanning process is conducted;

a pull-down circuit configured to pull down the potential of the control end of the pull-up circuit and the scanning signals outputting at the current level during a pull-down phase;

a pull-down maintaining circuit configured to continuously pull down the potential of the control end of the pull-up circuit and the scanning signals outputting at the current level during the pull-down phase;

wherein a number of the first clock signals is configured to be m, first control signals of the register units located prior to (m+1)-th level is configured to be first initial signals (STV_F), fourth control signals of the register units located prior to the (m+1)-th level is configured to be second initial signals (STV_R); and second control signals of the register units located behind (m−1)-th level is configured to be the second initial signals (STV_R), third control signals of the register units located behind the (m−1)-th is configured to be first initial signals (STV_F).

6. The bidirectional shift register according to claim 5, wherein the pull-down circuit comprises a first pull-down circuit and a second pull-down circuit;

the first pull-down circuit is configured to pull down the potential of the scanning signals outputting at the current level during a pull-down phase;

the second pull-down circuit is configured with a forward pull-down sub-circuit and a backward pull-down sub-circuit, wherein the forward pull-down sub-circuit is configured to pull down the potential of the control end of the pull-up circuit during the pull-down phase of the forward scanning process, and the backward pull-down sub-circuit is configured to pull down the potential of the control end of the pull-up circuit during the pull-down phase of the backward scanning process.

7. The bidirectional shift register according to claim 6, wherein the forward pull-up sub-circuit further comprises a first transistor, a control end of the first transistor couples with first control signals, an input end of the first transistor couples with forward voltage signals, and an output end of the first transistor couples with the control end of the pull-up circuit;

the backward pull-up sub-circuit further comprises a second transistor;

a control end of the second transistor couples with second control signals, an input end of the second transistor couples with the backward voltage signals, and an output end of the second transistor couples with the control end of the pull-up circuit;

wherein the forward voltage signals are configured to be high level signals and the backward voltage signals are configured to be low level signals when conducting the forward scanning process, the forward voltage signals are configured to be low level signals and the backward voltage signals are high level signals when conducting the backward scanning process.

8. The bidirectional shift register according to claim 7, wherein the first pull-down circuit comprises a third transistor, a control end of the third transistor couples with second clock signals, an input end of the third transistor couples with the low level signals, and an output end of the third transistor couples with the control end of the scanning signals outputting at the current level;

the forward pull-down sub-circuit comprises a fourth transistor, a control end of the fourth transistor couples with third control signals, an input end of the fourth transistor couples with the low level signals, and an output end of the fourth transistor couples with the control end of the pull-up circuit;

the backward pull-down sub-circuit comprises a fifth transistor, a control end of the fifth transistor couples with fourth control signals, an input end of the fifth transistor couples with the low level signals, and an output end of the fifth transistor couples with the control end of the pull-up circuit;

wherein phases of the second clock signals and the first clock signals are complementary.

9. The bidirectional shift register according to claim 8, wherein the pull-up circuit at least comprises a sixth transistor and a bootstrap capacitor, a control end of the sixth transistor couples with the pull-up control circuit, the pull-down circuit, and the pull-down maintaining circuit, an input end of the sixth transistor couples with the first clock signals, and an output end of the sixth transistor couples with the scanning signals outputting at the current level;

the bootstrap capacitor couples between the control end and the output end of the sixth transistor, and the bootstrap capacitor is configured to pull up the potential of the control end of the sixth transistor.

10. The bidirectional shift register according to claim 9, wherein the pull-up circuit further comprises a seventh transistor, a control end of the seventh transistor couples with the control end of the sixth transistor, an input end of the seventh transistor couples with the first clock signals, and an output end of the seventh transistor couples with down-transfer signals at the current level, wherein the pull-up circuit is further configured to transform the first clock signals into the down-transfer signals.

11. The bidirectional shift register according to claim 10, wherein a number of the first clock signals is configured to be m, the down-transfer signals of the register unit at the N-th level is configured to be ST(N), the first control signals of the register unit at the N-th level is configured to be ST(N−m/2), the second control signals of the register unit at the N-th level is configured to be ST(N+m/2), the third control signals of the register unit at the N-th level is configured to be ST(N−m), the fourth control signals of the register unit at the N-th level is configured to be ST(N+m).

12. The bidirectional shift register according to claim 5, wherein the pull-down maintaining circuit comprises a first pull-down maintaining sub-circuit and a second pull-down maintaining sub-circuit, wherein the first pull-down maintaining sub-circuit and the second pull-down maintaining sub-circuit are configured to continuously pull down the potential of the control end of the pull-up circuit and the scanning signals outputting at the current level during the pull-down phase according to fifth control signals and sixth control signals respectively;

wherein phases of the fifth control signals and the sixth control signals are complementary, and the potential of the fifth control signals and the sixth control signals change for each predetermined time interval.

13. A display panel, comprising a bidirectional shift register configured with a plurality of bidirectional shift register units serially connected, wherein the bidirectional shift register unit comprises:

a pull-up circuit configured to transform first clock signals into scanning signals outputting at a current level;

a pull-up control circuit configured with a forward pull-up sub-circuit and a backward pull-up sub-circuit, wherein the forward pull-up sub-circuit is configured to pull up a potential of a control end of the pull-up circuit when a forward scanning process is conducted, and the backward pull-up sub-circuit is configured to pull up the potential of the control end of the pull-up circuit when a backward scanning process is conducted;

a pull-down circuit configured to pull down the potential of the control end of the pull-up circuit and the scanning signals outputting at the current level during a pull-down phase;

a pull-down maintaining circuit configured to continuously pull down the potential of the control end of the pull-up circuit and the scanning signals outputting at the current level during the pull-down phase;

wherein a number of the first clock signals is configured to be m, first control signals of the register units located prior to (m+1)-th level is configured to be first initial signals (STV_F), fourth control signals of the register units located prior to the (m+1)-th level is configured to be second initial signals (STV_R); and second control signals of the register units located behind (m−1)-th level is configured to be the second initial signals (STV_R), third control signals of the register units located behind the (m−1)-th level is configured to be first initial signals (STV_F).

14. The display panel according to claim 13, wherein the pull-down circuit comprises a first pull-down circuit and a second pull-down circuit;

the first pull-down circuit is configured to pull down the potential of the scanning signals outputting at the current level during a pull-down phase;

the second pull-down circuit is configured with a forward pull-down sub-circuit and a backward pull-down sub-circuit, wherein the forward pull-down sub-circuit is configured to pull down the potential of the control end of the pull-up circuit during the pull-down phase of the forward scanning process, and the backward pull-down sub-circuit is configured to pull down the potential of the control end of the pull-up circuit during the pull-down phase of the backward scanning process.

15. The display panel according to claim 14, wherein the forward pull-up sub-circuit further comprises a first transistor, a control end of the first transistor couples with first control signals, an input end of the first transistor couples with forward voltage signals, and an output end of the first transistor couples with the control end of the pull-up circuit;

the backward pull-up sub-circuit further comprises a second transistor;

a control end of the second transistor couples with second control signals, an input end of the second transistor couples with the backward voltage signals, and an output end of the second transistor couples with the control end of the pull-up circuit;

wherein the forward voltage signals are configured to be high level signals and the backward voltage signals are configured to be low level signals when conducting the forward scanning process, the forward voltage signals are configured to be low level signals and the backward voltage signals are high level signals when conducting the backward scanning process.

16. The display panel according to claim 15, wherein the first pull-down circuit comprises a third transistor, a control end of the third transistor couples with second clock signals, an input end of the third transistor couples with the low level signals, and an output end of the third transistor couples with the control end of the scanning signals outputting at the current level;

the forward pull-down sub-circuit comprises a fourth transistor, a control end of the fourth transistor couples with third control signals, an input end of the fourth transistor couples with the low level signals, and an output end of the fourth transistor couples with the control end of the pull-up circuit;

the backward pull-down sub-circuit comprises a fifth transistor, a control end of the fifth transistor couples with fourth control signals, an input end of the fifth transistor couples with the low level signals, and an output end of the fifth transistor couples with the control end of the pull-up circuit;

wherein phases of the second clock signals and the first clock signals are complementary.

17. The display panel according to claim 16, wherein the pull-up circuit at least comprises a sixth transistor and a bootstrap capacitor, a control end of the sixth transistor couples with the pull-up control circuit, the pull-down circuit, and the pull-down maintaining circuit, an input end of the sixth transistor couples with the first clock signals, and an output end of the sixth transistor couples with the scanning signals outputting at the current level;

the bootstrap capacitor couples between the control end and the output end of the sixth transistor, and the bootstrap capacitor is configured to pull up the potential of the control end of the sixth transistor.

18. The display panel according to claim 17, wherein the pull-up circuit further comprises a seventh transistor, a control end of the seventh transistor couples with the control end of the sixth transistor, an input end of the seventh transistor couples with the first clock signals, and an output end of the seventh transistor couples with down-transfer signals at the current level, wherein the pull-up circuit is further configured to transform the first clock signals into the down-transfer signals.

19. The display panel according to claim 18, wherein a number of the first clock signals is configured to be m, the down-transfer signals of the register unit at the N-th level is configured to be ST(N), the first control signals of the register unit at the N-th level is configured to be ST(N−m/2), the second control signals of the register unit at the N-th level is configured to be ST(N+m/2), the third control signals of the register unit at the N-th level is configured to be ST(N−m), the fourth control signals of the register unit at the N-th level is configured to be ST(N+m).

20. The display panel according to claim 13, wherein the pull-down maintaining circuit comprises a first pull-down maintaining sub-circuit and a second pull-down maintaining sub-circuit, wherein the first pull-down maintaining sub-circuit and the second pull-down maintaining sub-circuit are configured to continuously pull down the potential of the control end of the pull-up circuit and the scanning signals outputting at the current level during the pull-down phase according to fifth control signals and sixth control signals respectively;

wherein phases of the fifth control signals and the sixth control signals are complementary, and the potential of the fifth control signals and the sixth control signals change for each predetermined time interval.

\* \* \* \* \*